(12) United States Patent
Okawa et al.

(10) Patent No.: US 8,482,277 B2
(45) Date of Patent: Jul. 9, 2013

(54) SURGE CURRENT DETECTION DEVICE

(75) Inventors: Takayuki Okawa, Tokyo (JP);
Hideyoshi Saeki, Tokyo (JP); Takuya Ouchi, Tokyo (JP)

(73) Assignee: Sankosha Corporation, Tokyo (JP)

( * ) Notice: Subject to any disclaimer, the term of this patent is extended or adjusted under 35 U.S.C. 154(b) by 5 days.

(21) Appl. No.: 13/410,656

(22) Filed: Mar. 2, 2012

(65) Prior Publication Data

US 2012/0256618 A1  Oct. 11, 2012

(30) Foreign Application Priority Data

Apr. 7, 2011  (JP) ................................ 2011-085465

(51) Int. Cl.
*G01R 13/04* (2006.01)

(52) U.S. Cl.
USPC ........... 324/113; 324/263; 324/213; 324/219; 324/117 R; 361/118; 361/93.1; 361/88; 361/65

(58) Field of Classification Search
USPC ........................................................ 324/113
See application file for complete search history.

(56) References Cited

U.S. PATENT DOCUMENTS

| | | | |
|---|---|---|---|
| 4,180,775 A | 12/1979 | Hsieh | |
| 4,375,617 A | 3/1983 | Schweitzer, Jr. | |
| 5,583,429 A * | 12/1996 | Otaka | 324/127 |
| 6,713,671 B1 * | 3/2004 | Wang et al. | 174/391 |
| 8,319,628 B2 * | 11/2012 | Schweitzer et al. | 340/539.1 |
| 2004/0201374 A1 * | 10/2004 | Kawase | 324/117 R |
| 2005/0242804 A1 * | 11/2005 | Hintz et al. | 324/244 |
| 2009/0234583 A1 * | 9/2009 | Dwyer et al. | 702/4 |
| 2010/0013457 A1 * | 1/2010 | Nero, Jr. | 324/119 |
| 2011/0121816 A1 | 5/2011 | Okawa et al. | |

FOREIGN PATENT DOCUMENTS

| | | |
|---|---|---|
| DE | 33 25 370 A1 | 1/1985 |
| DE | 38 23 389 C1 | 8/1989 |
| EP | 2 325 958 A1 | 5/2011 |
| JP | 05-016578 A | 1/1993 |
| JP | 11-076801 A | 3/1999 |
| JP | 2005-150657 A | 6/2005 |
| JP | 2006-244889 A | 9/2006 |
| JP | 2007-242569 A | 9/2007 |
| WO | 90/03018 A1 | 3/1990 |

* cited by examiner

*Primary Examiner* — Arleen M Vazquez
*Assistant Examiner* — Thang Le
(74) *Attorney, Agent, or Firm* — Carrier Blackman & Associates, P.C.; Joseph P. Carrier; William D. Blackman (57) ABSTRACT

A surge current detection device 30 is detachably attached to a conductor 11 and detects a surge current entering the conductor 11. The surge current detection device 30 includes: a holder 40 releasably holding the conductor 11 via first and second holder bodies 40-1 and 40-2 facing each other; a magnetic force concentrating member 60 having a substantially U-shaped cross-section, the magnetic force concentrating member 60 being secured inside the holder 40 and concentrating a magnetic flux included in a magnetic field generated by the surge current entering the magnetic flux conductor 11 to a high density at a predetermined detection region; and a magnetic material sheet 70 secured inside the holder 40 in such a manner that the magnetic material sheet 70 is positioned at the detection region, the magnetic material sheet 70 detecting the surge current.

5 Claims, 10 Drawing Sheets

SURGE CURRENT DETECTION DEVICE

BACKGROUND ART

1. Field of the Invention

The present invention relates to a surge current detection device provided in, e.g., a protector for insulating (i.e., protecting) a piece of equipment such as a communication circuit or a power supply circuit from a surge current, for example lightning, entering a conductor such as a communication wire or a power supply wire connected to the piece of equipment, to detect a state of the entrance of the surge current, such as a magnitude thereof, and specifically relates to a surge current detection device that upon entrance of a surge current, detects a state of the entrance of the surge current, using a magnetic field generated on a conductor.

2. Description of the Related Art

In recent years, with improvement in quality of pieces of equipment such as communication circuits and power supply circuits, there is a trend of increasing a number of cases in which devices are damaged by, e.g., lightning. For example, where lightning strikes around a facility, surge current flows from the site where lightning struck to the peripheral area. If the surge current enters the inside of the facility, the pieces of equipment in the facility may be damaged. Therefore, surge current detection devices that detect entrance of surge current are required.

Also, surge protection devices (SPD), which are protectors, are provided in facilities in order to prevent pieces of equipment from being damaged. In such protectors that serve to protect the pieces of equipment in the facilities from lightning surge current such as lightning, protective devices, which are lightning protection devices such as lightning protection tubes (i.e., arresters) and/or varistors included therein may also be damaged, and therefore, surge current detection devices that detect entrance of surge current are also required for protectors as in the facilities to be protected.

Protectors, in particular, e.g., varistors and arresters, which are internal protective devices, are devices that are deteriorated by application of surge current or surge voltage. As a result of the deterioration, the functions that the devices originally have may deteriorate, and thus, it is important to change a deteriorated protector promptly.

Examples of surge current detection devices, which are related art attempting to solve such problems, are disclosed in Japanese Patent Laid-Open Nos. 2005-150657, 2006-244889 and 2007-242569.

In a surge current detection device described in Japanese Patent Laid-Open No. 2005-150657, when a surge current generated by lightning flows in a conductor, a color of a heat-sensitive material is changed using Joule heat generated by the surge current to determine deterioration of a protective device such as a varistor. In other words, a heat-sensitive material is set in a protective device such as a varistor, and upon a surge current flowing and the protective device being activated, Joule heat is generated and changes the color of the heat-sensitive material.

A surge current detection device described in each of Japanese Patent Laid-Open Nos. 2006-244889 and 2007-242569, as in the aforementioned case, employs a determination method using Joule heat, which determines deterioration using shrinkage of a metal of a heat-shrinkable material. For example, the surge current detection device has a mechanism that upon shrinkage of a metal shrinkable material by Joule heat generated by a surge current, makes a display portion that has been shielded by the metal shrinkable material be exposed so that the display portion can be viewed, to perform determination.

Furthermore, in a technical field that is different from that of protectors, the art of magnetic display medium enabling visual check of content of information in a card is described in Japanese Patent Laid-Open No. 5-16578.

The magnetic display medium described in Japanese Patent Laid-Open No. 5-16578 includes an information storage portion and a magnetic display portion on a base. The information storage portion includes a magnetic tape or an integrated circuit (IC) memory. The magnetic display portion includes a substrate, and a recording layer containing microcapsules provided by coating on the substrate directly or via an intermediate layer. The microcapsule contains a liquid and magnetic powders (magnetic particles) that float in the liquid and are sensitive to a magnetic field, and based on information stored in the information storage portion, viewable information can be recorded on and erased from the recording layer in the magnetic display portion.

Also, a technique relating to a microcapsule is disclosed in Japanese Patent Laid-Open No. 11-76801.

However, the related art surge current detection devices described in Japanese Patent Laid-Open Nos. 2005-150657, 2006-244889 and 2007-242569 have problems (a) and (b) described below.

(a) In the related art devices, deterioration of a protective device such as a varistor or an arrester is determined using Joule heat generated by a surge current flowing in a conductor. A conductor in which a surge current flows needs to make the surge current flow quickly, and thus, needs the resistance value to be small. However, a surge current flows in a short period of time, and only a small amount of Joule heat is generated, resulting in a failure to provide favorable deterioration detection sensitivity.

(b) The device using a metal shrinkable material, etc., is a mechanical structure and thus, takes a lot of trouble in attaching the device to a conductor, and furthermore, is difficult to achieve reduction in size, weight and cost.

As described above, the related art surge current detection devices have the problems of a failure to provide favorable deterioration detection sensitivity, a lot of trouble taken in attaching the device to a conductor, and the difficulty of reduction in size, weight and cost.

In order to solve such problems, for example, a recording layer containing microcapsules, which is described in, e.g., Japanese Patent Laid-Open Nos. 5-16578 and 11-76801, may be applied to the related art to detect a surge current. However, a surge current such as lightning flows in an extremely short period of time, and thus, it is difficult to provide improved detection sensitivity.

SUMMARY OF THE INVENTION

Therefore, an object of the present invention is to provide a surge current detection device that skillfully solves the aforementioned problems in the related art, using the microcapsule technique, etc., in the related art.

In other words, a first object of the present invention is to provide a surge current detection device enabling change in a state of orientation of magnetic powders due to a surge current entering a conductor to be viewed more clearly, and thus enabling easy and correct detection of a magnitude of a surge current value and the number of surge current entrances.

A second object of the present invention is to provide a surge current detection device that is free of a risk caused by Joule heat as opposed to the related art, is safe and has a simple structure, enables reduction in size and cost, and requires no large space for attachment.

A third object of the present invention is to provide a surge current detection device that can easily be attached to or detached from a conductor.

In order to achieve the first, second and third objects, the present invention provides a surge current detection device detachably attached to a conductor, the surge current detection device detecting a surge current entering the conductor, the surge current detection device including: a holder including a first holder body and a second holder body facing each other, the holder releasably holding the conductor via the first and second holder bodies; a magnetic force concentrating member including a magnetic material, the magnetic force concentrating member being mounted on the first holder body side, removably receiving the conductor, and concentrating a magnetic flux included in a magnetic field generated by the surge current entering the conductor to a high density at a predetermined detection region; and a magnetic material sheet mounted on the second holder body side in such a manner that the magnetic material sheet is positioned at the detection region, the magnetic material sheet detecting the surge current.

Furthermore, the magnetic material sheet includes a sheet member including a front surface and a back surface, the back surface side being disposed at the detection region, a recording layer provided on the front surface side of the sheet member, the recording layer including a plurality of microcapsules each including a magnetic powder, whose state of orientation changes depending on the concentrated magnetic flux, encapsulated in a floating state in a liquid, the recording layer being capable of recording and erasing a state of entrance of the surge current therein and therefrom, and a light transmissive protection film covering the recording layer and allowing a state of the recording and the erasure in the recording layer to be viewed from an outside.

A surge current detection device according to an embodiment of the present invention is configured so that a magnetic flux included in a magnetic field generated by a surge current entering a conductor is concentrated to a high density at a predetermined detection region by a magnetic force concentrating member, to change a state of orientation of a magnetic powder in a microcapsule inside a magnetic material sheet. Thus, change in the state of orientation of the magnetic powder due to a surge current entering in a short period of time can be viewed more clearly, enabling easy and correct detection of a magnitude of a surge current value and the number of surge current entrances. As a result, the surge current detection device has no risk caused by Joule heat as in the related art and is safe, and because of having a configuration in which a magnetic material sheet is brought close to a conductor by a holder, has a simple structure, enables reduction in size and cost, and requires no large space for attachment. In addition, the holder is configured to releasably hold a conductor via first and second holder bodies, and a magnetic force concentrating member mounted in the holder is configured to removably receive the conductor. Thus, the surge current detection device can easily be attached to or detached from a conductor.

The foregoing objects and other objects and novel features of the present invention become apparent upon reading the following description of preferred embodiments with reference to the drawings. However, the below-indicated drawings are provided for description only and not intended to limit the scope of the present invention.

DESCRIPTION OF THE PREFERRED EMBODIMENTS

Embodiments of the present invention will be described below with reference to the attached drawings.
First Embodiment
(Configuration of First Embodiment)

Figure 1:
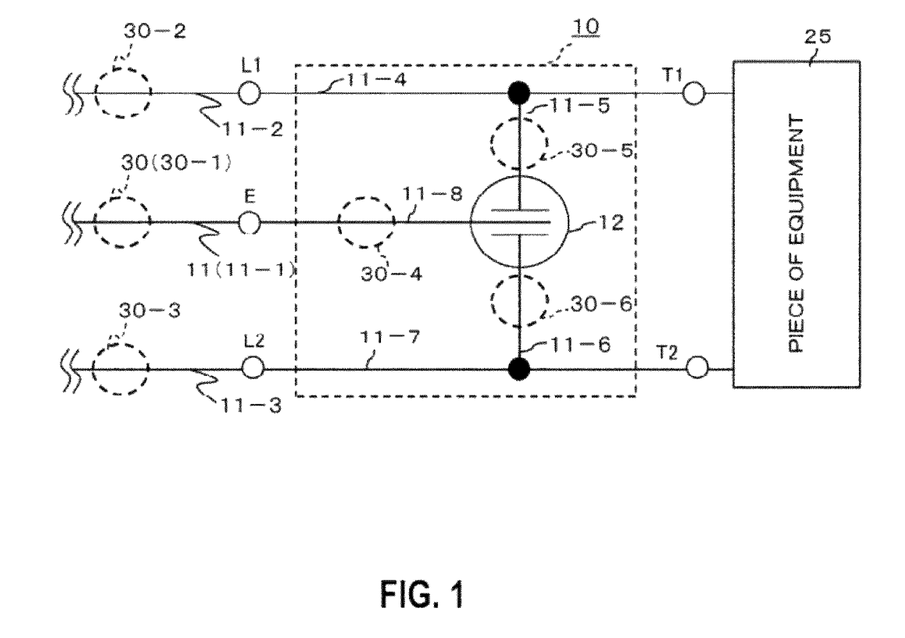
FIG. 1 is a circuit diagram illustrating a protector provided with surge current detection devices according to a first embodiment of the present invention.

FIG. 1 is a circuit diagram illustrating a protector provided with surge current detection devices according to a first embodiment of the present invention.

As illustrated in FIG. 1, a protector 10 is intended to protect a piece of equipment 25 such as a communication apparatus from a surge current such as lightning, and includes an earth terminal E connected to a conductor 11 (for example, 11-1), which is a grounding wire, two line-side terminals L1 and L2 connected to two conductors 11-2 and 11-3, respectively, which are lines such as a communication wire and a power supply wire, and two equipment-side terminals T1 and T2 connected to the piece of equipment 25. The line-side terminal L1 and the equipment-side terminal T1 are connected via a conductor 11-4, and the line-side terminal L2 and the equipment-side terminal T2 are connected via a conductor 11-7.

A first electrode of a protective device (for example, a three-electrode arrester, which is a three-electrode lightning protection tube) 12 is connected to the conductor 11-4 via an inter-line conductor 11-5, and a second electrode of the three-electrode arrester 12 is connected to the conductor 11-7 via an inter-line conductor 11-6. A third electrode of the three-electrode arrester 12 is connected to the earth terminal E via an earth-side conductor 11-8. For each of the conductors 11 (i.e., 11-1 to 11-8), a cable having a round shape in a cross-section and having a diameter depending on the withstanding current (for example, 3 to 4 mm, 5 to 6 mm, 7 to 10 mm) is used.

A surge current detection device 30 (for example, 30-1) is attached to the earth-side conductor 11-1, and furthermore, surge current detection devices 30-2 and 30-3 are attached to the line-side conductors 11-2 and 11-3, respectively. The respective surge current detection devices 30-1 to 30-3 are intended to detect a state of entrance of a surge current such as lightning entering the respective conductors 11-1 to 11-3 (for example, the entrance route, the magnitude of the entered current value, the number of entrances), and have a same configuration. Also, surge current detection devices 30 (for example, 30-4, 30-5 and 30-6) can be attached to the conductors 11-5, 11-6 and 11-8 in the protector 10.

Figure 2A:
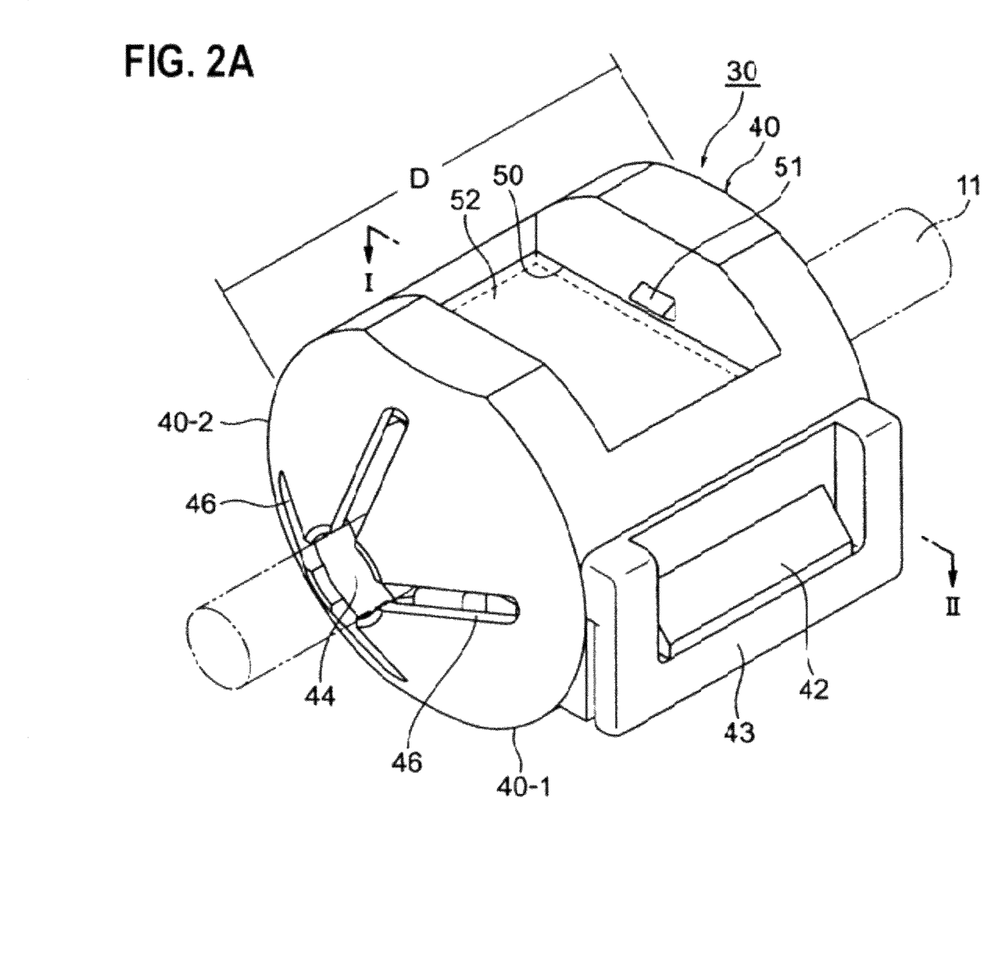
FIG. 2A is a perspective view illustrating a surge current detection device 30 in FIG. 1.
Figure 2B:
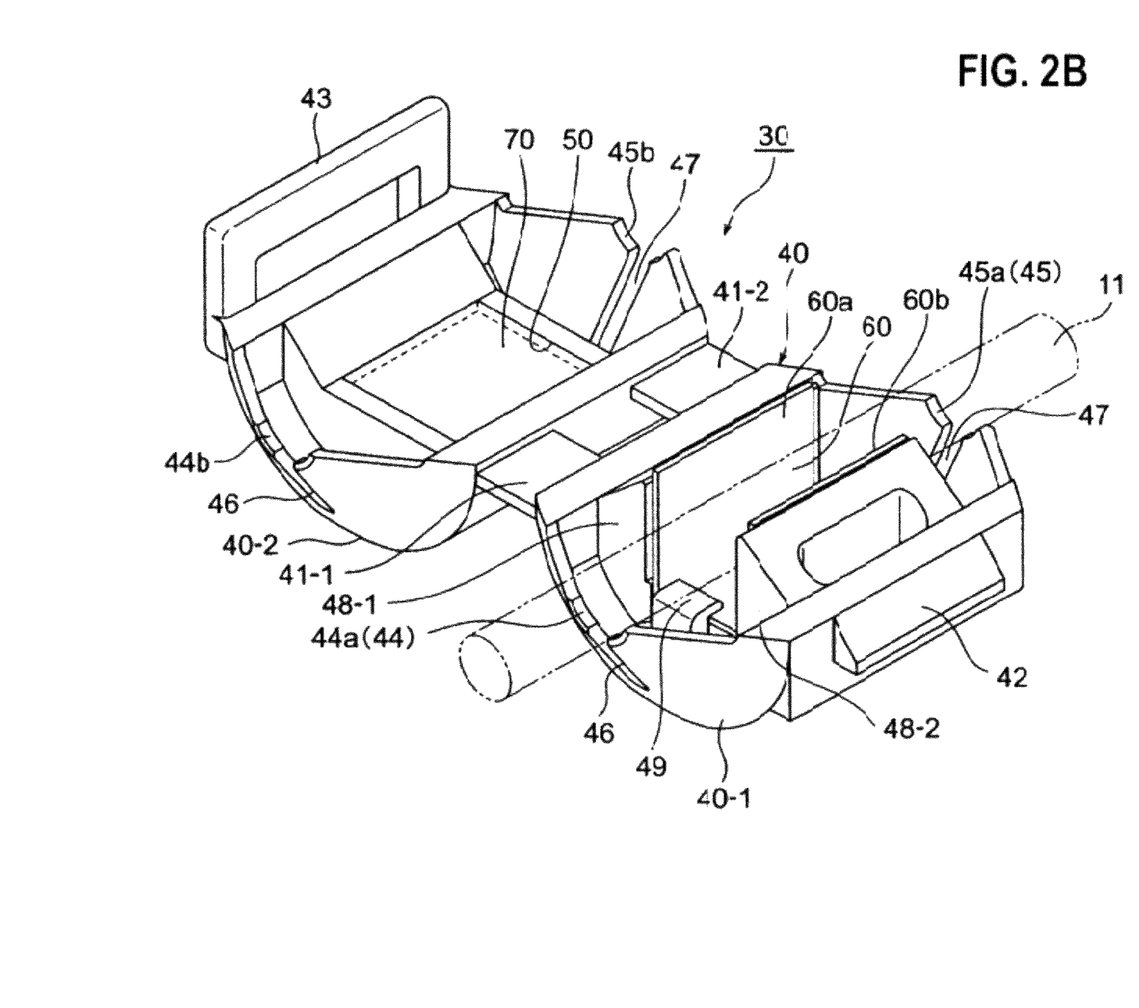
FIG. 2B is a perspective view illustrating an opened state of the surge current detection device 30 in FIG. 2A.
Figure 2C:
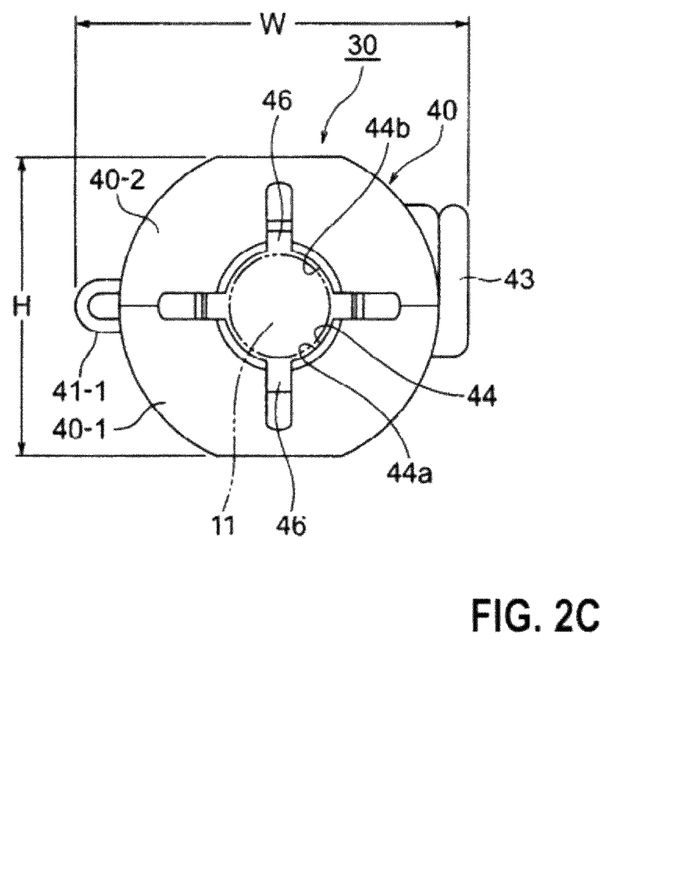
FIG. 2C is a left-side view illustrating the surge current detection device 30 in FIG. 2A.
Figure 2D:
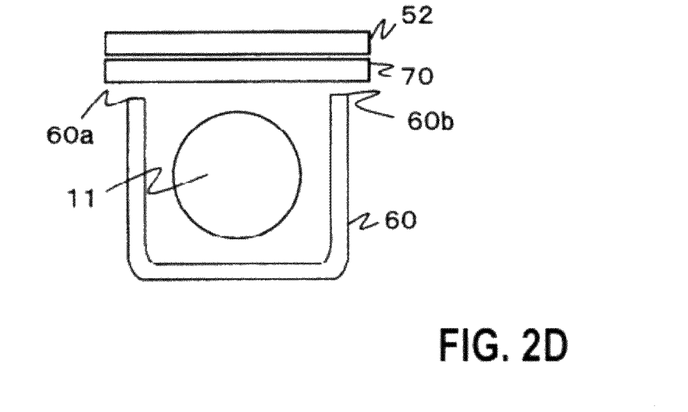
FIG. 2D is a schematic diagram illustrating a cross-section of the surge current detection device 30 in FIG. 2A along line I-II.

FIGS. 2A to 2D are configuration diagrams illustrating a surge current detection device 30 in FIG. 1: FIG. 2A is a perspective view illustrating the surge current detection device 30; FIG. 2B is a perspective view illustrating an opened state of the surge current detection device 30 in FIG. 2A; FIG. 2C is a left-side view illustrating the surge current detection device 30 in FIG. 2A; and FIG. 2D is a schematic diagram illustrating a cross-section of the surge current detection device 30 in FIG. 2A along line I-II.

As illustrated in FIGS. 2A to 2D, the surge current detection device 30 includes a substantially cylindrical holder 40 that releasably holds a conductor 11, a magnetic force concentrating member 60 having a plate-like shape with a substantially U-shaped cross-section, the magnetic force concentrating member 60 being secured inside the holder 40 and concentrating magnetic fluxes included in a magnetic field generated by a surge current entering the conductor 11 to a high density at a predetermined detection region, and a rectangular magnetic material sheet 70 secured to the holder 40 in such a manner that the rectangular magnetic material sheet 70 is positioned at the detection region, and allowing a state of the entrance of the surge current to be recorded therein.

For approximate external dimensions of the substantially-cylindrical holder 40, for example, a width W is 16 mm, a length D is 19 mm and a height H is 12 mm. The external dimensions of the holder 40 can be changed to arbitrary values depending on, e.g., the size of the conductor 11. The holder 40 includes a first holder body 40-1 and a second holder body 40-2 facing each other, resulting from the holder 40 being separated into two parts in a center axis direction, and the first holder body 40-1 and the second holder body 40-2 are integrally formed by an insulating member, such as a synthetic resin. One ends of the first and second holder bodies 40-1 and 40-2 are connected via two hinge portions 41-1 and 41-2, respectively. At the other end on the open side of the first holder body 40-1, an engaging projection 42 is provided. At the other end on the open side of the second holder body 40-2, an engaging frame 43 is provided at a position facing the engaging projection 42. The engaging projection 42 and the engaging frame 43 form an engaging part, and as a result of the engaging projection 42 being fitted into the engaging frame 43, the other ends on the open side of the first and second holder bodies 40-1 and 40-2 are detachably locked to each other.

At one ends of the first and second holder bodies 40-1 and 40-2, respective semicircular holes 44a and 44b, which forms a circular through hole 44, are formed. At the other ends of the first and second holder bodies 40-1 and 40-2, respective semicircular holes 45a and 45b, which forms a circular through hole 45, are formed so as to face the semicircular holes 44a and 44b forming the circular through hole 44. The circular through hole 44 formed by the semicircular holes 44a and 44b is a hole allowing the conductor 11 to pass therethrough. Around the through hole 44, a plurality of slits 46 is formed so as to provide a structure in which the hole is expandable/contractable to allow a conductor 11 having any of different diameters to pass therethrough. Similarly, the circular through hole 45 formed by the semicircular holes 45a and 45b is a hole allowing the conductor 11 to pass therethrough. Around the through hole 45, a plurality of slits 47 is formed so as to provide a structure in which the hole is expandable/contractable to allow a conductor 11 having any of different diameters to pass therethrough.

Inside the first holder body 40-1, a pair of receiving walls 48-1 and 48-2 facing each other, and a locking piece 49 positioned at an end portion of a bottom portion between the receiving walls 48-1 and 48-2 is provided. The magnetic force concentrating member 60 having a plate-like shape with a substantially U-shaped cross-section is mounted between the paired receiving walls 48-1 and 48-2 facing each other, and the magnetic force concentrating member 60 is secured by the locking piece 49.

The magnetic force concentrating member 60 includes a magnetic material having a plate-like shape with a substantially U-shaped cross-section (for example, a ferromagnetic material such as iron oxide, chromium oxide, cobalt or ferrite), and has a function that receives the conductor 11 to concentrate magnetic fluxes included in a magnetic field generated by a surge current entering the conductor 11 to a high density at a predetermined detection region (that is, a region in the vicinity of an area between open ends 60a and 60b of the magnetic force concentrating member 60).

In the second holder body 40-2, a rectangular opening portion 50 is formed at a position facing the open ends 60a and 60b of the magnetic force concentrating member 60. In the vicinity of a peripheral edge of the opening portion 50, a locking projection 51 is provided. A rectangular transparent plate 52 of, e.g., plastic is fitted in the opening portion 50, and the transparent plate 52 is secured by the locking projection 51. On the inner side of the transparent plate 52, a front surface of the rectangular magnetic material sheet 70 is disposed so as to be in contact with the transparent plate 52.

Figure 3A:
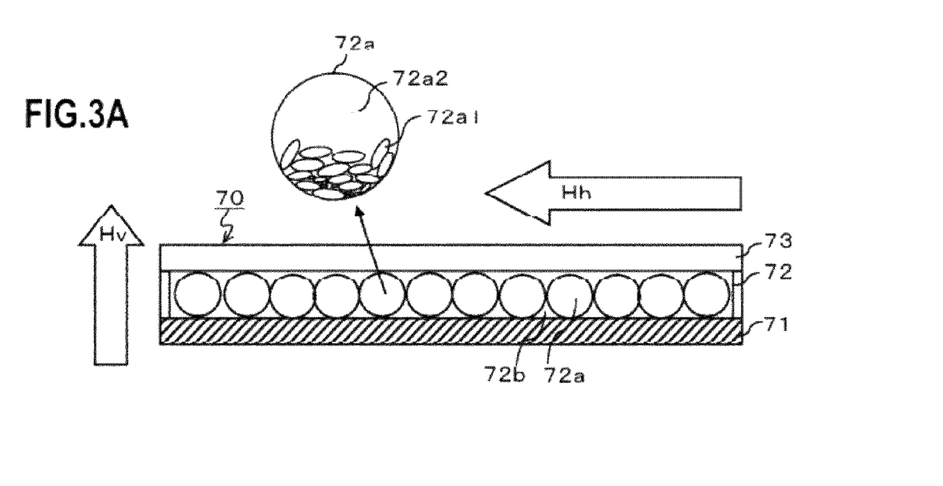
FIG. 3A is a schematic diagram illustrating a magnetic material sheet 70 in FIG. 2D.
Figure 3B:
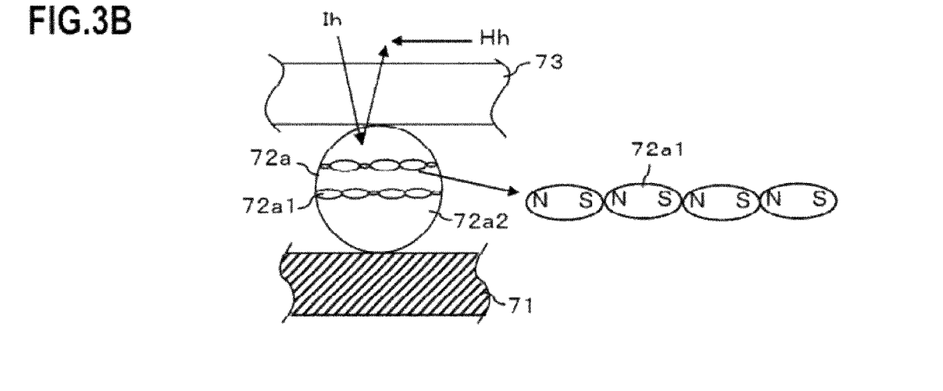
FIG. 3B is an enlarged partial view of FIG. 3A.
Figure 3C:
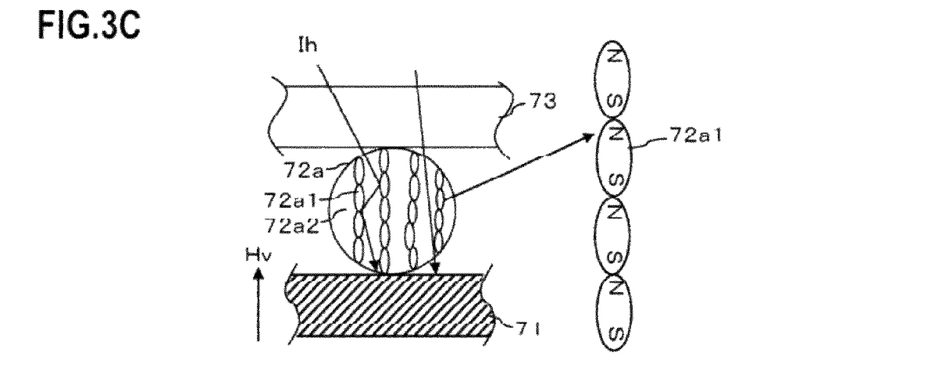
FIG. 3C is an enlarged partial view of FIG. 3A.

FIG. 3A is a schematic cross-sectional diagram illustrating the magnetic material sheet 70 in FIG. 2D, and FIGS. 3B and 3C are enlarged partial views of FIG. 3A.

As illustrated in FIG. 3A, the magnetic material sheet 70 is secured to the opening portion 50 of the second holder body 40-2, and a sheet member 71 is provided on the back surface side positioned on the inner side of the second holder body 40-2. The sheet member 71 includes, e.g., plastic, and is stained in a predetermined color so as to clearly indicate the contrast of the display. On the front surface side of the sheet member 71, a recording layer 72 allowing a state of entrance of a surge current to be recorded therein and erased therefrom is provided. The front surface side of the recording layer 72 is covered by a light transmissive protection film 73 allowing a state of the recording and the erasure in the recording layer 72 to be viewed from the outside. The light transmissive protection film 73 includes, for example, a transparent sheet of e.g., plastic. The front surface side of the protection film 73 is disposed so as to be in contact with the back surface side of the transparent plate 52.

The recording layer 72 between the sheet member 71 and the protection film 73 includes, e.g., a plurality of microcapsules 72a arranged on the front surface side of the sheet member 71, and a binder 72b, which is an adhesive charged between the respective microcapsules 72a. As described in, e.g., Japanese Patent Laid-Open Nos. 5-16578 and 11-76801, each microcapsule 72a is resulting from encapsulating a plurality of magnetic powders 72a1, whose state of orientation changes depending on the magnetic fluxes, in a floating state in a liquid 72a2 such as an organic solvent, and for example, has a spherical shape with a diameter of around 10 to 100 µm. For the magnetic powders 72a1, a mixture resulting from adequately mixing a hard magnetic material having a large coercive force such as a magnet material (e.g., ferrite or neodymium) into a soft magnetic material having a small coercive force such as an iron material is used, enabling obtainment of microcapsules 72a with a favorable coercive force. For example, microcapsules 72a with a favorable coercive force can be obtained by mixing flakes (thin pieces) of hard magnetic material with an aspect ratio of approximately 5 and a particle diameter of around 0.1 to 2 µm into flakes (thin pieces) of a soft magnetic material with an aspect ratio of approximately 10 and a particle diameter of around 2 to 10 µm in a proportion of 3 to 15%.

The magnetic material sheet 70 configured as described above, for example, upon application of a horizontal magnetic field Hh thereto as illustrated in FIG. 3B, the magnetic powders 72a1 are oriented in a horizontal direction and lined up transversely, and incoming light Ih entering the protection film 73 from the outside via the transparent plate 52 is reflected by surfaces of the magnetic powders 72a1. Consequently, colors of the surfaces of the magnetic powders 72a1 can be viewed through the protection film 73. Meanwhile, as illustrated in FIG. 3C, upon application of a vertical magnetic field Hv thereto, the magnetic powders 72a1 are oriented in a vertical direction and lined up vertically, and incoming light Ih entering the protection film 73 from the outside via the transparent plate 52 reaches the front surface of the sheet member 71, but the light Ih tends to reflect in many directions, and thus, a color of the sheet member 71 cannot be viewed. Thus, for example, regardless of whether the color of the sheet member 71 is white or red, the sheet member 71 substantially looks black in its entirety.

(Method for Attachment of Surge Current Detection Device)

A method for attaching the surge current detection device 30 to the conductor 11 will be described.

As illustrated in FIG. 2B, the first holder body 40-1 and the second holder body 40-2 of the holder 40 including the magnetic force concentrating member 60 and the magnetic material sheet 70 mounted inside are opened with the hinge portions 41-1 and 41-2 as an axis. The magnetic force concentrating member 60 having a U-shaped cross-section, which is mounted inside the first holder body 40-1, and the semicircular holes 44a and 45a are fitted onto an outer periphery of the conductor 11. Next, the second holder body 40-2 including the magnetic material sheet 70 mounted inside is closed to the first holder body 40-1 side with the hinge portions 41-1 and 41-2 as an axis, and the engaging projection 42 on the first holder body 40-1 side is fitted into the engaging frame 43 on the second holder body 40-2 side, thereby the first and second holder bodies 40-1 and 40-2 being secured.

Consequently, the surge current detection device 30 is attached to the outer periphery of the conductor 11. In the attached state, as illustrated in FIG. 2D, the conductor 11 is received in the magnetic force concentrating member 60, and the region in the vicinity of the area between the open ends 60a and 60b is maintained occluded by the magnetic material sheet 70.

(Operation of Protector)

Figure 4A:
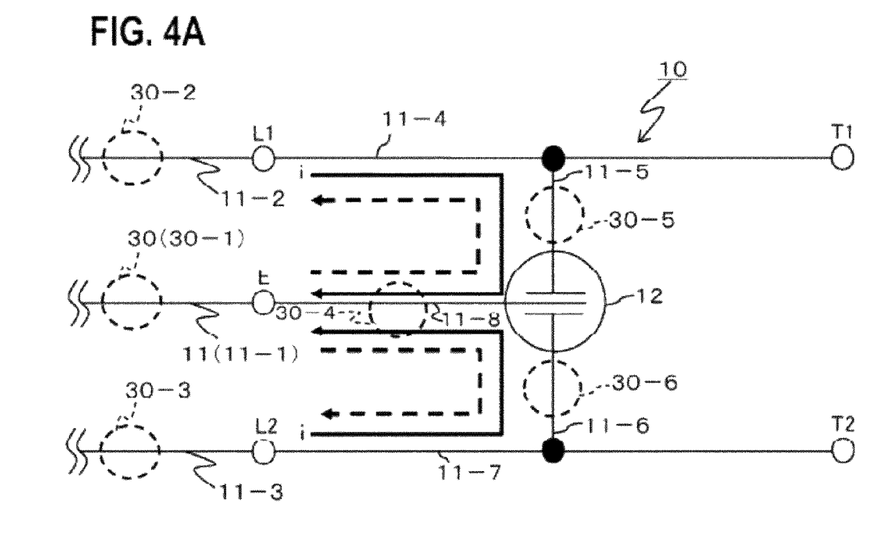
FIG. 4A is a circuit diagram illustrating an operation of a protector 10 in FIG. 1 for line-to-ground flow (i.e., in common mode)

FIG. 4A is a circuit diagram illustrating an operation of the protector 10 in FIG. 1 for line-to-ground flow (i.e., common mode). Also, FIG. 4B is a circuit diagram illustrating an operation of the protector 10 in FIG. 1 for line-to-line flow (i.e., normal mode).

In the line-to-ground flow in FIG. 4A (i.e., common mode), where a surge current i entering from the line-side terminals L1 and L2 via the conductors 11-2 and 11-3 as a result of, e.g., lightning has positive polarity, the arrester 12 operates to discharge based on an abnormal voltage. Thus, as indicated by solid arrows, the entered surge current i flows from the line-side terminal L1 to the earth terminal E through the conductor 11-4, the conductor 11-5 at which the surge current detection device 30-5 is set, the arrester 12 and the conductor 11-8, and also flows from the line-side terminal L2 to the earth terminal E through the conductor 11-7, the conductor 11-6 at which the surge current detection device 30-6 is set, the arrester 12 and the conductor 11-8. Consequently, the piece of equipment 25 connected to the equipment-side terminals T1 and T2 is protected from the surge current i. In this case, the surge current detection devices 30-1 to 30-6 operate.

Meanwhile, where the surge current i entering the line-side terminals L1 and L2 via the conductors 11-2 and 11-3 has negative polarity, the arrester 12 operates to discharge based on an abnormal voltage, and as indicated by dashed lines, the entered surge current i flows to the line-side terminals L1 and L2 through routes in a direction opposite to that of the above case, and the piece of equipment 25 connected to the equipment-side terminals T1 and T2 is protected from the surge current i. In this case, the surge current detection devices 30-1 to 30-6 operate.

Figure 4B:
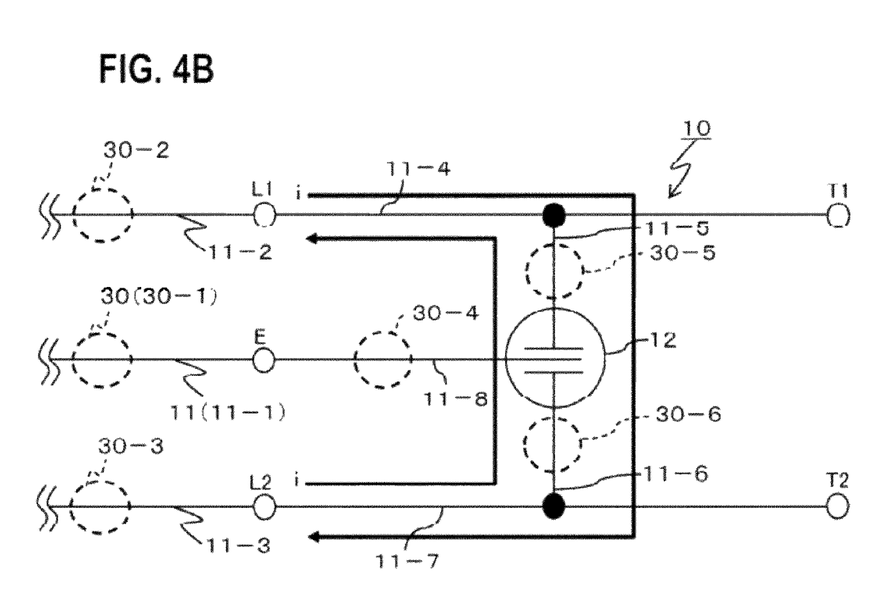
FIG. 4B is a circuit diagram illustrating an operation of the protector 10 in FIG. 1 for line-to-line flow (i.e., in normal mode)

In the line-to-line flow in FIG. 4B (i.e., normal mode), where a surge current i having positive polarity enters the line-side terminal L1 via the conductor 11-2 as a result of, e.g., lightning, the arrester 12 operates to discharge based on an abnormal voltage. Thus, as indicated by solid lines, the entered surge current i flows from the conductor 11-4 to the line-side terminal L2 through the conductor 11-5 at which the surge current detection device 30-5 is set, the arrester 12, the conductor 11-6 at which the surge current detection device 30-6 is set, and the conductor 11-7. Consequently, the piece of equipment 25 connected to the equipment-side terminals T1 and T2 is protected from the surge current i. In this case, the surge current i does not flow to the earth terminal E, and thus, the surge current detection devices 30-2, 30-5, 30-6 and 30-3 operate.

Meanwhile, where a surge current i having positive polarity enters the line-side terminal L2 via the conductor 11-3, the arrester 12 operates to discharge based on an abnormal voltage, and as indicated by solid lines, the entered surge current i flows to the line-side terminal L1 through a route in a direction opposite to that of the above case, and the piece of equipment 25 connected to the equipment-side terminals T1 and T2 is protected from the surge current i. In this case, the surge current i does flow to the earth terminal E, and thus, the surge current detection devices 30-3, 30-6, 30-5 and 30-2 operate.

(Operation of Surge Current Detection Device According to First Embodiment)

Figure 5A:
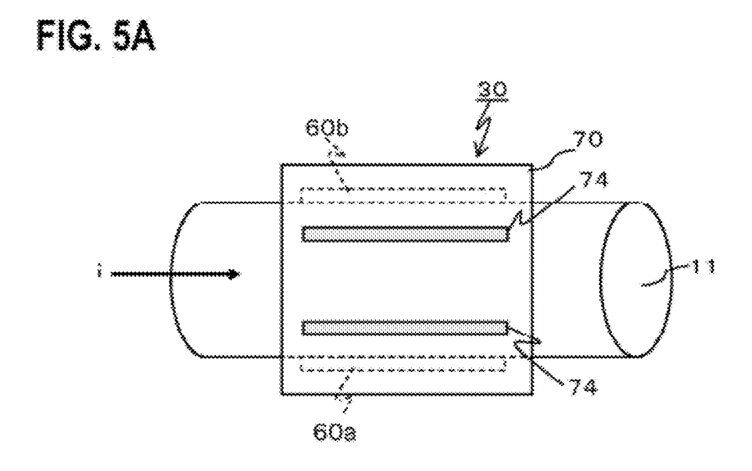
FIG. 5A is a schematic diagram for illustrating an operation of the surge current detection device 30 in FIG. 2A, which is a plan view of a magnetic material sheet 70 on the front surface side.

FIG. 5A is a schematic diagram for describing an operation of the surge current detection device 30 in FIG. 2A, which is a plan view viewed from the front surface side of the magnetic material sheet 70. Furthermore, FIG. 5B is a right-side view of FIG. 5A.

Figure 5B:
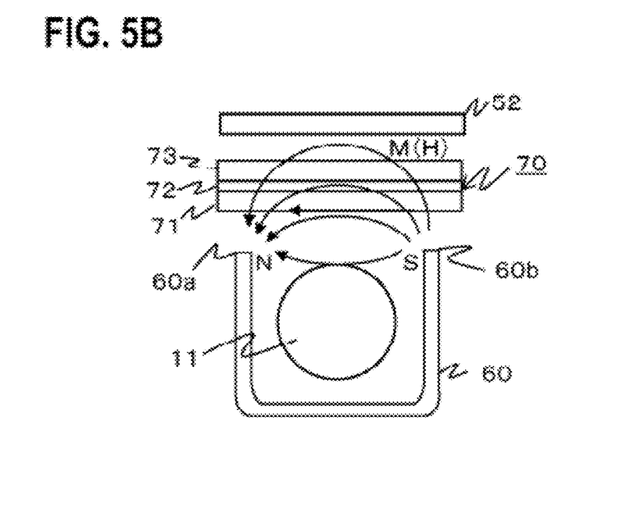
FIG. 5B is a right-side view of FIG. 5A.

As illustrated in FIG. 5A, upon a surge current i flowing to the conductor 11 in the surge current detection device 30 attached to the conductor 11 rightward as indicated by the arrow, as illustrated in FIG. 5B, a magnetic field (magnetic field) H is generated around the conductor 11, and thus, magnetic fluxes (magnetic fluxes) M included in the magnetic field H are uniformly generated counterclockwise as indicated by arrows from the open end 60b on the south pole side toward the open end 60a on the north pole side of the magnetic force concentrating member 60. The magnetic fluxes M are uniformly generated in a periphery of the conductor 11 are concentrated to a high density at the region in the vicinity of the area between the open ends 60a and 60b, which is the predetermined detection region, by the magnetic force concentrating member 60.

Thus, in the recording layer 72 in the magnetic material sheet 70 disposed above the area between the open ends 60a and 60b of the magnetic force concentrating member 60 by the holder 40, horizontal magnetic fluxes M are imposed on microcapsules 72a positioned above the open ends 60a and 60b, and thus, the magnetic powders 72a1 in each of the microcapsules 72a are lined up transversely and the color of the surfaces of the magnetic powders 72a1 appear on the front surface of the protection film 73 in the magnetic material sheet 70. Meanwhile, oblique magnetic fluxes M are imposed on microcapsules 72a obliquely above the area between the open ends 60a and 60b, the magnetic powders 72a1 in each of the microcapsules 72a are lined up obliquely and parts that are somewhat blackish appears on the front surface of the protection film 73. Consequently, positions of the protection film 73 that face opposite sides of the area between the open ends 60a and 60b, a surge current detection result 74, which includes two lines, appears, enabling change in a state of orientation of the magnetic powders 72a1 to be viewed more clearly.

Here, entrance of the surge current i to the conductor 11 can be viewed by means of two lines, which are included in the surge current detection result 74, and furthermore, a magnitude of the surge current value and the number of surge current entrances can be detected according to the thicknesses of the two lines.

FIGS. 6A to 6D are diagrams each illustrating a surge current detection result 74 (i.e., 74a to 74d) of a test using the surge current detection device 30 in FIG. 2A.

Figure 6A:
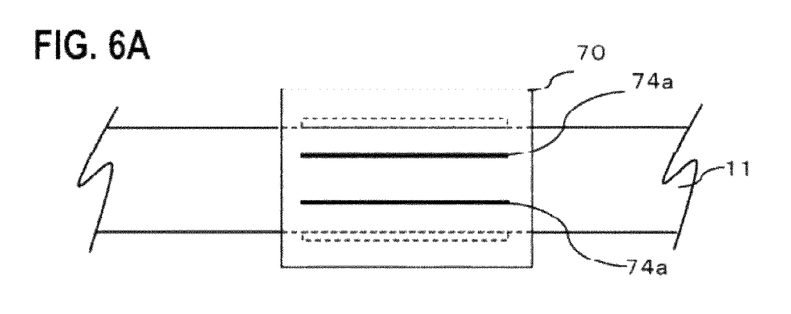
FIG. 6A is a diagram illustrating a surge current detection result 74a of a test using the surge current detection device 30 in FIG. 2A.
Figure 6B:
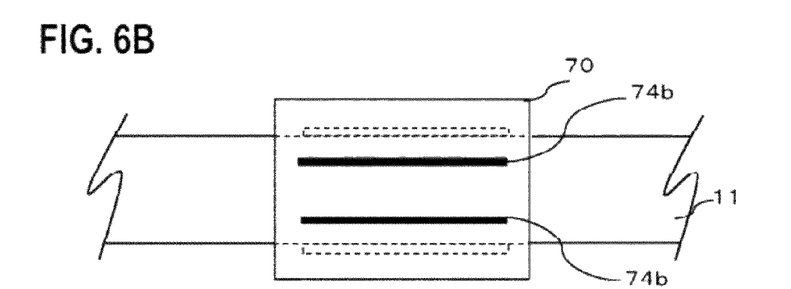
FIG. 6B is a diagram illustrating a surge current detection result 74b of a test using the surge current detection device 30 in FIG. 2A.
Figure 6C:
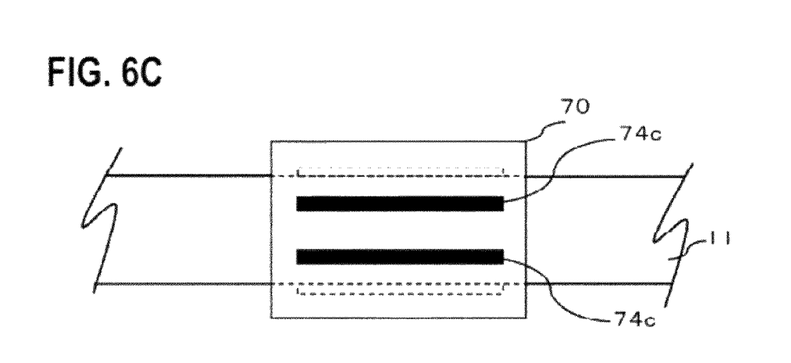
FIG. 6C is a diagram illustrating a surge current detection result 74c of a tested using the surge current detection device 30 in FIG. 2A.
Figure 6D:
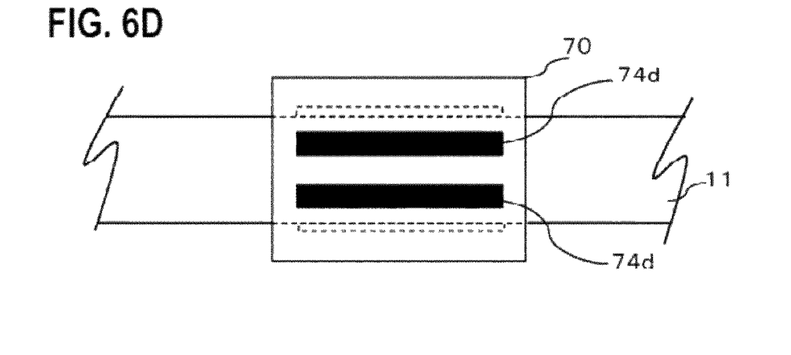
FIG. 6D is a diagram illustrating a surge current detection result 74d of a test using the surge current detection device 30 in FIG. 2A.

FIG. 6A illustrates a surge current detection result 74a where the surge current i is 500 A and the number of applications is one. Similarly, FIG. 6B illustrates a surge current detection result 74b where the surge current i is 1 kA and the number of applications is one, FIG. 6C illustrates a surge current detection result 74c where the surge current I is 2 kA and the number of applications is one, ad FIG. 6D illustrates a surge current detection result 74d where the surge current i is 2 kA and the number of applications is three.

As is clear from FIGS. 6A to 6D, as the magnitude of the entered surge current value and the number of entrances are increased, two lines that are included in each of the surge current detection results 74 (i.e., 74a, 74b, 74c and 74d) is thicker. Thus, from the thicknesses of the two lines, the magnitude of the surge current value and the number of entrances can be detected.

(Effects of First Embodiment)

The first embodiment provides the effects described in (1) to (5) below.

(1) Magnetic fluxes M included in a magnetic field H (i.e., Hh or Hv) generated by a surge current i entering the conductor 11 is concentrated to a high density at a predetermined detection region (that is, a region in the vicinity of the area between the open ends 60a and 60b of the magnetic force concentrating member 60) by the magnetic force concentrating member 60, to change a state of orientation of the magnetic powders 72a1 in the microcapsules 72a in the magnetic material sheet 70. Thus, change in the state of orientation of the magnetic powders 72a1 due to a surge current i entering in a short period of time can be viewed more clearly, enabling simple and correct detection of the magnitude of the surge current value and the number of entrances.

(2) Because of the effect described in (1) above, there is no risk caused by Joule heat as opposed to the related art, and in addition, since the magnetic material sheet 70 is brought close to the conductor 11 by the holder 40, it is possible to provide a simple structure, and reduction in size and cost, and no large space is required for attachment.

(3) The holder 40 includes a two-part structure including the first and second holder bodies 40-1 and 40-2, and in addition, the magnetic force concentrating member 60 mounted in the holder 40 has a substantially U-shaped cross-section. Thus, the surge current detection device 30 can easily be attached to the conductor 11 by opening the first and second holder bodies 40-1 and 40-2, putting the substantially U-shaped magnetic force concentrating member 60 on the outer periphery of the conductor 11 and closing the first and second holder bodies 40-1 and 40-2. Also, the surge current detection device 30 can easily be detached from the conductor 11 by opening the first and second holder bodies 40-1, 40-2 and taking the magnetic force concentrating member 60 away from the conductor 11.

(4) Since the pluralities of slits 46 and 47 are formed around the through holes 44 and 45, the through holes 44 and 45 are expandable/contractable, enabling the surge current detection device 30 to be attached to a conductor 11 having any of different diameters. A structure in which the through holes 44 and 45 are expandable/contractable can be provided by forming the peripheries of the through holes 44 and 45 using a flexible member instead of the pluralities of slits 46 and 47.

(5) The holder 40 having a two-part structure including the first and second holder bodies 40-1 and 40-2 is formed in an integrated manner, facilitating the manufacture and enabling reduction in cost.

Second Embodiment (Configuration of Second Embodiment)

Figure 7A:
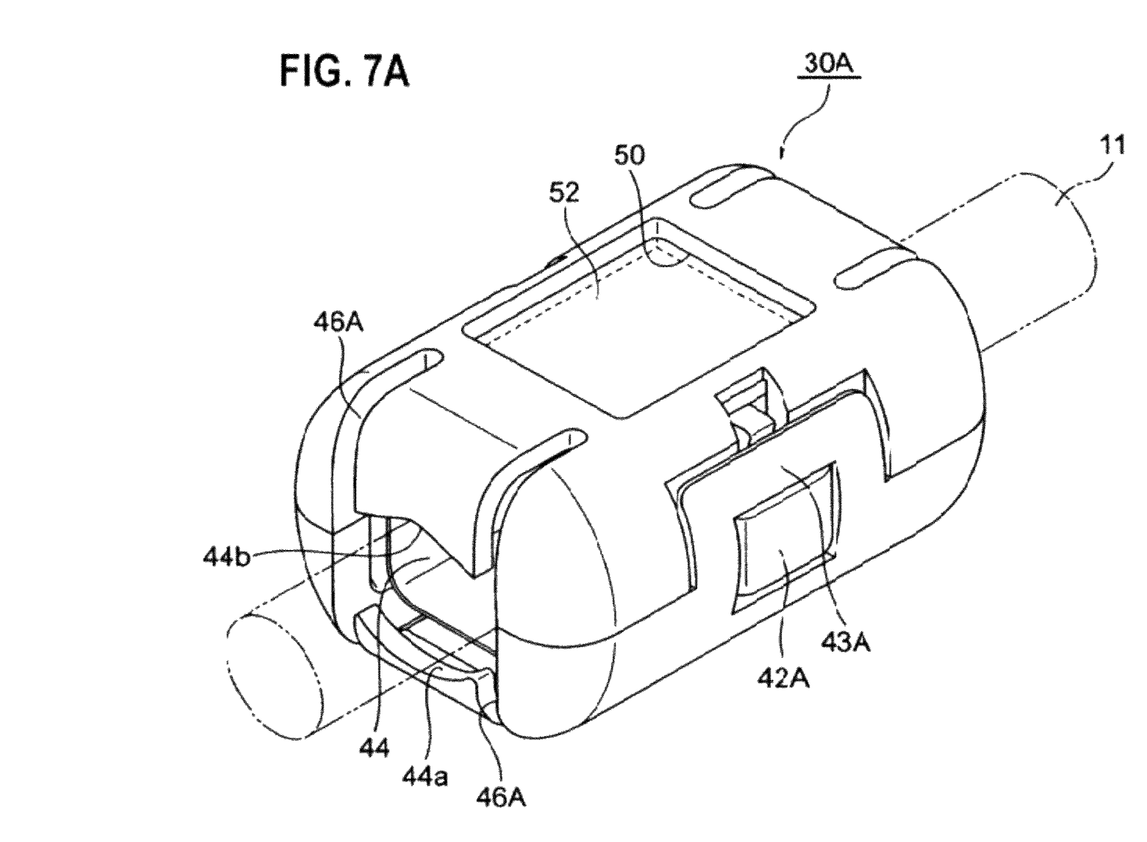
FIG. 7A is a perspective view illustrating a surge current detection device according to a second embodiment of the present invention.
Figure 7B:
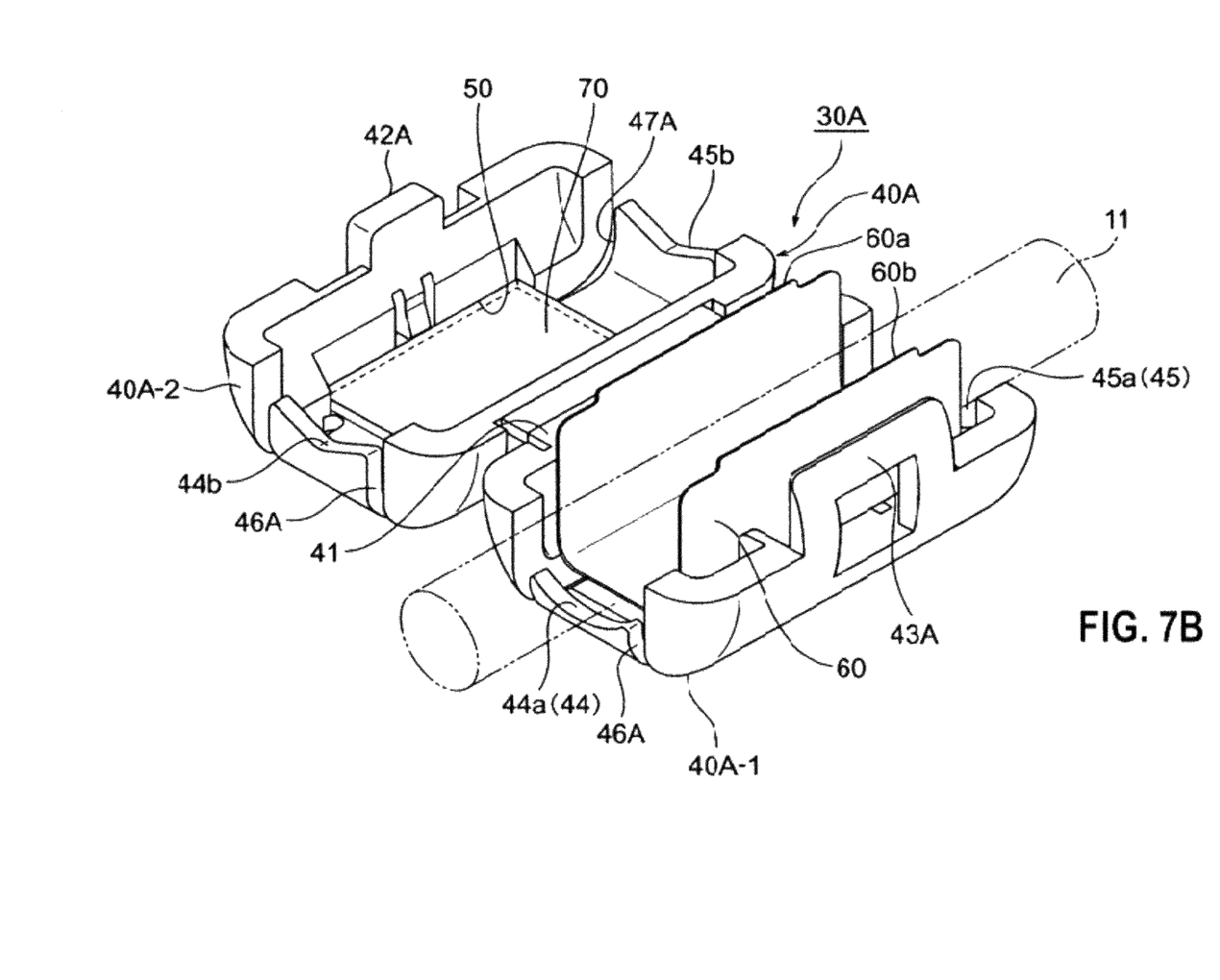
FIG. 7B is a perspective view illustrating an opened state of the surge current detection device in FIG. 7A.

FIG. 7A is a perspective view illustrating a surge current detection device according to a second embodiment of the present invention. Furthermore, FIG. 7B is a perspective view illustrating an opened state of the surge current detection device in FIG. 7A. In FIGS. 7A and 7B, components that are in common to those of the first embodiment in FIGS. 2A and 2B are provided with reference numerals that are in common to those of the first embodiment.

A surge current detection device 30A according to the second embodiment includes a holder 40A having a substantial polygonal prism shape, which is different from the substantially-cylindrical holder 40 according to the first embodiment. Inside the polygonal prism-shaped holder 40A, a magnetic force concentrating member 60 and a magnetic material sheet 70 that are substantially similar to those of the first embodiment are mounted.

The substantially polygonal prism-shaped holder 40A includes a first holder body 40A-1 and a second holder body 40A-2 facing each other, resulting from the holder 40A being separated into two parts in a center axis direction, and the first holder body 40A-1 and the second holder body 40A-2 are integrally formed by an insulating member such as a synthetic resin. One ends of the first and second holder bodies 40A-1 and 40A-2 are connected via one hinge portion 41. At the other end on the open side of the first holder body 40A-1, an engaging frame 43A is provided. At the other end on the open side of the second holder body 40A-2, an engaging projection 42A is provided at a position facing the engaging frame 43A. The engaging projection 42A and the engaging frame 43A form an engaging part, and as a result of the engaging projection 42A being fitted into the engaging frame 43A, the other ends on the open side of the first and second holder bodies 40A-1 and 40A-2 are detachably locked to each other.

As in the first embodiment, semicircular holes 44a and 44b, which form a circular through hole 44, are formed at one ends of the first and second holder bodies 40A-1 and 40A-2, respectively. Also, as in the first embodiment, semicircular holes 45a and 45b, which forms a circular through hole 45, are formed at the other ends of the first and second holder bodies 40A-1 and 40A-2 so as to face the semicircular holes 44a and 44b forming the circular through hole 44, respectively. The circular through hole 44 formed by the semicircular holes 44a and 44b is a hole allowing a conductor 11 to pass therethrough. As in the first embodiment, a plurality of slits 46A is formed around the through hole 44 to provide a structure in which the hole is expandable/contractable to allow a conductor 11 having any of different diameters to pass therethrough. Similarly, the circular through hole 45 formed by the semicircular holes 45a and 45b is a hole allowing the conductor 11 to pass therethrough. As in the first embodiment, a plurality of slits 47A is formed around the through hole 45 to provide a structure in which the hole is expandable/contractable to allow a conductor 11 having any of different diameters to pass therethrough.

The through holes 44 and 45 in the second embodiment are formed on the opposite ends of the substantially-polygonal prism-shaped holder 40A, and thus, the diameter of the holes is restricted compared to the first embodiment. Accordingly, the surge current detection device 30A according to the second embodiment is suitable for a thinner conductor 11 compared to the first embodiment.

As in the first embodiment, inside the first holder body 40A-1, a magnetic force concentrating member 60 having a plate-like shape with a substantially U-shaped cross-section is mounted. Inside the second holder body 40A-2, a rectangular opening portion 50 is formed at a position facing open ends 60a and 60b of the magnetic force concentrating member 60 as in the first embodiment. A rectangular transparent plate 52 of, e.g., plastic is secured to the opening portion 50, which is substantially similar to the first embodiment. On the inner side of the transparent plate 52, a front surface of the rectangular magnetic material sheet 70 is disposed so as to be in contact with the transparent plate 52 as in the first embodiment.

(Method for Attachment of Surge Current Detection Device)

A method for attaching the surge current detection device 30A to the conductor 11 will be described.

As illustrated in FIG. 7B, the first holder body 40A-1 and the second holder body 40A-2 of the holder 40A including the magnetic force concentrating member 60 and the magnetic material sheet 70 mounted inside are opened with the hinge portion 41 as an axis. The magnetic force concentrating member 60 having a U-shaped cross-section, which is mounted inside first holder body 40A-1, and the semicircular holes 44a and 45a are fitted onto an outer periphery conductor 11. Next, the second holder body 40A-2 including the magnetic material sheet 70 mounted inside is closed to the first holder body 40A-1 side with the hinge portion 41 as an axis, and the engaging projection 42A on the second holder body 40A-2 side is fitted into the engaging frame 43A on the first holder body 40A-1 side, thereby the first and second holder bodies 40A-1 and 40A-2 being secured.

Consequently, the surge current detection device 30A is attached to the outer periphery of the conductor 11. In the attached state, as in FIG. 2D in the first embodiment, the conductor 11 is received in the magnetic force concentrating member 60, and a region in the vicinity of an area between the open ends 60a and 60b of the magnetic force concentrating member 60 is maintained occluded by the magnetic material sheet 70.

(Operation and Effects of Second Embodiment)

Although the surge current detection device 30A according to the second embodiment has an overall shape that is different from the surge current detection device 30 according to the first embodiment, can operate as in the first embodiment, and provide effects substantially similar to those of the first embodiment. Since the through holes 44 and 45 in the second embodiment are formed at the opposite ends of the substantially polygonal prism-shaped holder 40A, the diameter of the holes is restricted compared to the first embodiment, and thus, the surge current detection device 30A according to the second embodiment is suitable for a thinner conductor 11 compared to the first embodiment.

(Variations of First Embodiment and Second Embodiment)

The present invention is not limited to the first embodiment and the second embodiment, and various modes of use and variations are possible. Examples of the modes of use and variations include those described in (i) to (iii) below.

(i) The holder 40 or 40A for mounting the magnetic force concentrating member 60 and the magnetic material sheet 70 may be changed to have a shape and structure other than those illustrated in the drawings. For example, in FIGS. 2B and 7B, the hinge portion(s) 41-1 and 41-2 or 41 in the holder 40 or 40A are removed to separate the first holder body 40-1 or 40-1A and the second holder body 40-2 or 40-2A, and detachable fitting parts such as recesses and projections are provided at a part of connection between the first holder body 40-1 or 40A-1 and the second holder body 40-2 or 40-2A. With such configuration, a conductor 11 is held between the first holder body 40-1 or 40A-1 and the second holder body 40-2 or 40-2A, and the first holder body 40-1 or 40A-1 and the second holder body 40-2 or 40-2A are fitted to each other by the fitting parts, enabling the surge current detection device 30 or 30A to be easily attached to the conductor 11.

(ii) The magnetic force concentrating member 60 and the magnetic material sheet 70 may be changed to have shapes and structures other than those illustrated in the drawings.

(iii) A circuit configuration of a protector 10 to which a surge current detection device 30 or 30A according to the first embodiment or the second embodiment is applied not limited to that of the protector 10 in FIG. 1, and a protector having any of various circuit configurations may be employed.

What is claimed is:

1. A surge current detection device detachably attached to a conductor, the surge current detection device detecting a surge current entering the conductor, the surge current detection device comprising:

a holder including a first holder body and a second holder body facing each other, the holder releasably holding the conductor via the first and second holder bodies;

a magnetic force concentrating member including a magnetic material, the magnetic force concentrating member being mounted on the first holder body side, removably receiving the conductor, and concentrating a magnetic flux included in a magnetic field generated by the surge current entering the conductor to a high density at a predetermined detection region; and a magnetic material sheet mounted on the second holder body side in such a manner that the magnetic material sheet is positioned at the detection region, the magnetic material sheet detecting the surge current, wherein that the magnetic material sheet includes a sheet member including a front surface and a back surface, the back surface side being disposed at the detection region, a recording layer provided on the front surface side of the sheet member, the recording layer including a plurality of microcapsules each including a magnetic powder, whose state of orientation changes depending on the concentrated magnetic flux, encapsulated in a floating state in a liquid, the recording layer being capable of recording and erasing a state of entrance of the surge current therein and therefrom, and a light transmissive protection film covering the recording layer and allowing a state of the recording and the erasure in the recording layer to be viewed from an outside.

2. The surge current detection device according to claim 1, wherein:
the magnetic force concentrating member includes the magnetic material having a plate-like shape having a substantially U-shaped cross-section, the magnetic material removably receiving the conductor; and
the detection region includes a region in a vicinity of an area between open ends of the substantially U-shaped magnetic material.

3. The surge current detection device according to claim 1, wherein the first and second holder bodies each include an expandable/contractable through hole allowing the conductor to pass therethrough.

4. The surge current detection device according to claim 3, wherein a slit is formed around the through hole so that the through hole is expandable/contractable.

5. The surge current detection device according to claim 1, wherein:
one ends of the first and second holder bodies are connected via a hinge portion;
the other ends of the first and second holder bodies are open and detachably locked to each other by an engaging part.

* * * * *